United States Patent
Greim

(10) Patent No.: US 10,162,025 B2
(45) Date of Patent: Dec. 25, 2018

(54) HIGH-FREQUENCY COIL FOR MAGNETIC RESONANCE IMAGING

(71) Applicant: Siemens Aktiengesellschaft, Munich (DE)

(72) Inventor: Helmut Greim, Adelsdorf (DE)

(73) Assignee: Siemens Aktiengesellschaft, Munich (DE)

( * ) Notice: Subject to any disclaimer, the term of this patent is extended or adjusted under 35 U.S.C. 154(b) by 364 days.

(21) Appl. No.: 15/008,643

(22) Filed: Jan. 28, 2016

(65) Prior Publication Data

US 2016/0216345 A1  Jul. 28, 2016

(30) Foreign Application Priority Data

Jan. 28, 2015 (DE) .................. 10 2015 201 462

(51) Int. Cl.
| | | |
|---|---|---|
| *G01R 33/36* | (2006.01) | |
| *G01R 33/34* | (2006.01) | |
| *G01R 33/341* | (2006.01) | |
| *G01R 33/3415* | (2006.01) | |
| *G01R 33/48* | (2006.01) | |

(52) U.S. Cl.
CPC ..... *G01R 33/34092* (2013.01); *G01R 33/341* (2013.01); *G01R 33/3415* (2013.01); *G01R 33/3642* (2013.01); *G01R 33/3657* (2013.01); *G01R 33/481* (2013.01); *G01R 33/4816* (2013.01)

(58) Field of Classification Search
CPC ............ G01R 33/34092; G01R 33/341; G01R 33/3415; G01R 33/3642; G01R 33/3657; G01R 33/481; G01R 33/4816
See application file for complete search history.

(56) References Cited

U.S. PATENT DOCUMENTS

| | | | |
|---|---|---|---|
| 5,361,764 A | 11/1994 | Reynolds et al. | |
| 5,951,474 A * | 9/1999 | Matsunaga | G01R 33/34061 324/318 |
| 7,970,452 B2 * | 6/2011 | Piron | A61B 5/415 600/411 |
| 9,869,735 B2 * | 1/2018 | Leussler | G01R 33/4215 |
| 2010/0033186 A1 * | 2/2010 | Overweg | A61B 5/055 324/318 |
| 2012/0032678 A1 * | 2/2012 | Vaughan, Jr. | G01R 33/3415 324/318 |
| 2013/0076361 A1 * | 3/2013 | Taniguchi | G01R 33/34046 324/322 |
| 2013/0225980 A1 * | 8/2013 | Biber | A61B 5/055 600/422 |
| 2014/0125339 A1 * | 5/2014 | Lee | G01R 33/3415 324/319 |
| 2014/0132264 A1 * | 5/2014 | Kim | G01R 33/4835 324/309 |
| 2014/0176138 A1 * | 6/2014 | Imamura | G01R 33/4215 324/322 |

(Continued)

*Primary Examiner* — Ruifeng Pu

(74) *Attorney, Agent, or Firm* — Schiff Hardin LLP

(57) ABSTRACT

In order to allow a determination of the position of a radio-frequency coil assembly, the radio-frequency coil assembly for magnetic resonance imaging has a housing element with a wall, a first receiving coil and a second receiving coil, and the first receiving coil and the second receiving coil are arranged on two opposite sides of the wall of the housing element.

12 Claims, 4 Drawing Sheets

(56) References Cited

U.S. PATENT DOCUMENTS

| | | | |
|---|---|---|---|
| 2014/0194727 A1* | 7/2014 | Boskamp | G01R 33/0076 600/411 |
| 2015/0087958 A1 | 3/2015 | Kartmann et al. | |
| 2016/0022142 A1* | 1/2016 | Bradshaw | A61B 5/0555 600/415 |
| 2016/0320464 A1* | 11/2016 | Kim | G01R 33/3415 |
| 2016/0322852 A1* | 11/2016 | Yeh | H02J 7/025 |
| 2016/0349337 A1* | 12/2016 | Park | A61B 5/004 |
| 2017/0252578 A1* | 9/2017 | Halkola | A61N 5/1049 |

\* cited by examiner

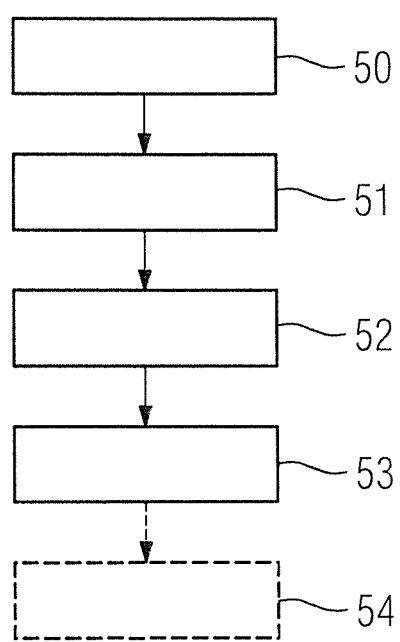

HIGH-FREQUENCY COIL FOR MAGNETIC RESONANCE IMAGING

BACKGROUND OF THE INVENTION

Field of the Invention

The invention relates to a radio-frequency coil assembly for magnetic resonance imaging, as well as to a method for determining a position of a housing element of a radio-frequency coil assembly, and to a magnetic resonance apparatus having such a radio-frequency coil.

Description of the Prior Art

In a magnetic resonance apparatus, also known as a magnetic resonance tomography system, the body of an examination subject, such as a patient, that is to be examined is exposed by operation of a basic field magnet, to a relatively high basic magnetic field of, for example 1.5, 3, or 7 Tesla. In addition, gradient fields are applied with the use of a gradient coil assembly. Radio-frequency pulses, for example excitation pulses, are then transmitted via an excitation system by appropriate antenna devices, which result in the nuclear spins of certain atoms that have been resonantly excited by these radio-frequency pulses to be tilted by a defined flip angle with respect to the magnetic field lines of the basic magnetic field. During the relaxation of the nuclear spins, radio-frequency signals, known as magnetic resonance signals, which are received by an appropriate radio-frequency coil assembly and then further processed, are emitted. To receive the magnetic resonance signals, the radio-frequency coil assembly can include at least one radio-frequency antenna. The desired image data can be reconstructed from the raw data acquired in this way.

Such a radio-frequency coil assembly for receiving the magnetic resonance signals can be designed as a local radio-frequency coil assembly. Such a local radio-frequency coil assembly is usually positioned in a patient accommodation region of the magnetic resonance scanner in direct proximity of the patient to receive the magnetic resonance signals. This means that the local radio-frequency coil assembly can detect the magnetic resonance signals in the proximity of their place of origin in a particularly advantageous manner. The local radio-frequency coil assembly can be arranged at various positions on the patient and is frequently designed in a flexible manner. A local radio-frequency coil assembly therefore often has an unknown geometry and/or an unknown arrangement and/or an unknown position during the scan.

In certain applications it is desirable to determine the spatial position and/or geometry of the local radio-frequency coil assembly during a magnetic resonance scan. This is an advantage in particular when the local radio-frequency coil assembly is used to acquire magnetic resonance signals for magnetic resonance scans in combination with a positron emission tomography scan (PET scan). The combination of magnetic resonance scans with PET scans requires knowledge that is as precise as possible with regard to the position and/or the arrangement and/or the geometry of the local radio-frequency coil assembly in order to determine with precision any signal attenuation that photons in a PET scan experience when passing through the local radio-frequency coil assembly. If the local radio-frequency coil assembly is not taken into account in the attenuation correction, this can lead to PET events being missed in the PET data and/or to image artifacts in the reconstructed image data.

SUMMARY OF THE INVENTION

An object of the invention is to address the problem of determining the position of a radio-frequency coil assembly.

The radio-frequency coil assembly according to the invention for magnetic resonance imaging has a housing that has a housing element forming a wall, a first receiving coil and a second receiving coil, with the first receiving coil and the second receiving coil being arranged on two opposite sides of the wall of the housing.

The radio-frequency coil assembly can include, in addition to the first receiving coil and to the second receiving coil at least one radio-frequency antenna, which is designed to receive magnetic resonance signals that are emitted by an examination object. The at least one radio-frequency antenna is designed differently from the first receiving coil and from the second receiving coil. This may mean that the first receiving coil and the second receiving coil are not designed so as to receive magnetic resonance signals that are emitted by an examination object. The first receiving coil and the second receiving coil form closed structures through which a current can flow.

The radio-frequency coil assembly can include a number of housing elements. The housing element, in particular the wall of the housing element, is typically designed of a plastic. Consequently, nuclear spins of the housing element will emit magnetic resonance signals after a radio-frequency excitation. When using a magnetic resonance sequence with a short echo time, in particular an ultra-short echo time of less than one millisecond, preferably in the microsecond range, magnetic resonance signals could be acquired from the housing element. The at least one radio-frequency antenna in the inventive radio-frequency coil assembly is, however, typically positioned too far away from the housing element, for the at least one radio-frequency antenna to be able to acquire magnetic resonance signals that are emitted by the housing element. The at least one radio-frequency antenna is thus not sensitive enough for imaging of the at least one housing element to be possible by the at least one radio-frequency antenna. In addition, a magnetic resonance signal from the housing element received by the at least one radio-frequency antenna is typically overshadowed by stronger magnetic resonance signals emitted by the examination object.

By contrast, the first receiving coil and the second receiving coil are intended to receive magnetic resonance signals that are emitted by the housing element, in particular by the wall of the housing element. For this purpose, the first receiving coil and the second receiving coil are arranged in a particularly advantageous manner with respect to the housing element, so that the first receiving coil and the second receiving coil can receive magnetic resonance signals that are emitted by the wall of the housing element. Furthermore, the advantageous arrangement of the first receiving coil and the second receiving coil may lead to a desired suppression of magnetic resonance signals that are emitted by the examination object, such that the corresponding magnetic resonance signals can be acquired selectively by the housing element.

For this purpose, the first receiving coil and the second receiving coil are arranged in a particularly advantageous manner on the two facing sides, in particular on surfaces that face each other, of the wall of the housing element, in particular directly on the wall. The wall of the housing element is located such that it is between the first receiving coil and the second receiving coil. The wall can spatially separate the first receiving coil and the second receiving coil from each other. The first receiving coil and the second receiving coil can be arranged in the same section of the housing element on opposite sides of the wall.

The first receiving coil and the second receiving coil are arranged with only a small physical distance between them. Due to the physical proximity of the first receiving coil and the second receiving coil, a magnetic coupling can form between the first receiving coil and the second receiving coil, as described in more detail below. Due to the magnetic coupling between the first receiving coil and the second receiving coil, at least one receiving mode, preferably two receiving modes, of the first receiving coil and the second receiving coil, can form. The at least one receiving mode can be resonant and/or able to vibrate. The discussion below describes the scenario in which a push-pull vibration mode forms between the first receiving coil and the second receiving coil.

A receiving mode, in particular the push-pull receiving mode, which forms due to the physical proximity of the first receiving coil and the second receiving coil, can lead to an increased reception sensitivity of the first receiving coil and the second receiving coil in a spatial region of the wall of the housing element. This means that the first receiving coil and the second receiving coil can detect, with particularly high signal strength, the magnetic resonance signals that are emitted by the wall. At the same time, in the receiving mode, suppression of reception of magnetic resonance signals emitted by an examination object (a patient) can occur. In this way, the first receiving coil and the second receiving coil can selectively acquire the magnetic resonance signals that are emitted by the wall, with any interfering superimposition of magnetic resonance signals that are emitted by the examination object being suppressed and/or avoided completely.

A magnetic resonance coil assembly according to the invention consequently allows a simple and clear detection of the housing element, namely of the wall of the housing element, in magnetic resonance image data reconstructed from the magnetic resonance signals that are received by the first receiving coil and the second receiving coil. The housing element (wall) that has been detected can then be used for detection of the position and/or geometry of the radio-frequency coil assembly during a magnetic resonance scan. With the use of a stored model of the radio-frequency coil assembly, in particular of the housing element and/or the wall, a precise detection of the position and/or geometry of the radio-frequency coil assembly can ensue. In this way, the presence of the radio-frequency coil assembly can be taken into account during attenuation correction of nuclear medicine image data, for example of PET image data or SPECT image data, in a combined magnetic resonance scan. Further applications are also conceivable in which detection of the position and/or geometry of the radio-frequency coil assembly may prove to be advantageous. One such example is the planning of a magnetic resonance sequence that can ensue in a particularly advantageous manner using the detected position and/or geometry of the radio-frequency coil assembly.

In an embodiment, the wall has an inside and an outer side, and the first receiving coil is arranged on the inside and the second receiving coil is arranged on the outer side. The housing element is designed to surround a circuit, such as an electronic amplification circuit, of the radio-frequency coil assembly. The wall of the housing element can either completely or partly surround this circuit. The inside of the wall is then the side of the wall that faces the circuit. The outer side of the wall is then the side of the wall that faces away from the circuit. The fact that the first receiving coil and the second receiving coil are arranged on two opposite sides of the wall of the housing element then means that the first receiving coil is arranged on the inside of the wall and the second receiving coil is arranged on the outer side of the wall. A particularly advantageous positioning of the first receiving coil and the second receiving coil is thereby achieved that allows the magnetic resonance signals emitted by the wall material to be particularly effectively acquired.

In another embodiment, the wall of the housing element surrounds an electronic amplification circuit of the radio-frequency coil assembly. The wall can enclose the electronic amplification circuit. The electronic amplification circuit is designed to amplify magnetic resonance signals that have been received by the at least one radio-frequency antenna. The electronic amplification circuit may also amplify magnetic resonance signals that have been received by the first receiving coil and/or the second receiving coil. The wall of the housing element encloses the electronic amplification circuit either completely or partially. The wall of the housing element can have an inside that faces the circuit and have an outer side that faces away from the electronic amplification circuit. Amplification of the magnetic resonance signals by the electronic amplification circuit assigned to the radio-frequency coil assembly may lead to particularly high signal strength of the magnetic resonance signals, which can subsequently be transmitted by the radio-frequency coil assembly to a processing computer of a magnetic resonance apparatus.

In another embodiment, at least one of the first receiving coil and the second receiving coil is arranged directly on the wall of the housing element. At least one of the first receiving coil and the second receiving coil is fixed directly onto the wall of the housing element. There is no clearance between the housing element and the first receiving coil and/or the second receiving coil. The at least one of the first receiving coil and the second receiving coil thus is arranged to have a close fit directly on the wall. Such a positioning of at least one of the first receiving coil and the second receiving coil leads to a particularly strong magnetic coupling between the first receiving coil and the second receiving coil. At the same time, the at least one of the first receiving coil and the second receiving coil can receive the magnetic resonance signals emitted by the wall materials with particularly high signal strength due to the direct physical proximity thereof. Alternatively, it is conceivable for the first receiving coil and/or the second receiving coil to be arranged some distance from the wall, by the presence of a spacer bar, for example.

In another embodiment, the first receiving coil has at least one first shortening capacitor and the second receiving coil has at least one second shortening capacitor. The at least one first shortening capacitor is connected in series to the first receiving coil, while the at least one second shortening capacitor is connected in series to the second receiving coil. The at least one first shortening capacitor is consequently designed to shorten an electrical length of the first receiving coil. The at least one second shortening capacitor is designed to shorten an electrical length of the second receiving coil. In this way, the first shortening capacitor can tune a reception frequency of the first receiving coil to a desired first reception frequency and the second shortening capacitor can tune a reception frequency of the second receiving coil to a desired second reception frequency. The first and second reception frequencies may be selected such that the first receiving coil and the second receiving coil are designed to be particularly suitable for receiving magnetic resonance signals that are emitted by the wall of the housing element. A particularly appropriate option for selecting the first and second reception frequencies is described in the following paragraph.

In this embodiment, the at least one first shortening capacitor has a first capacitance value that causes the first receiving coil to be tuned to a first reception frequency and the at least one second shortening capacitor to have a second capacitance value, and for the second receiving coil to be tuned to a second reception frequency, the first reception frequency and/or the second reception frequency being lower than a reception frequency for the magnetic resonance imaging. The reception frequency for the magnetic resonance imaging corresponds in particular to a reception frequency of the at least one radio-frequency antenna in the radio-frequency coil assembly. In this case, the reception frequency of the magnetic resonance imaging lies in a region of the proton precession frequency in the basic magnetic field of a magnetic resonance scanner in which the radio-frequency coil assembly is situated. For example, the reception frequency for the magnetic resonance imaging may be around 63 MHz at 1.5 Tesla or around 126 MHz at 3 Tesla. The first reception frequency and the second reception frequency are at least 0.5 MHz, advantageously at least 1 MHz, particularly advantageously at least 2.5 MHz, and most advantageously at least 5 MHz lower than the reception frequency for the magnetic resonance imaging. The first receiving coil and the second receiving coil are tuned to the same frequency, which is lower than the reception frequency for the magnetic resonance imaging. Through such an adjustment of the reception frequency of the first receiving coil and the second receiving coil, it is possible to achieve with a particularly strong signal the acquisition by the first receiving coil and the second receiving coil of magnetic resonance signals that are emitted by the wall of the housing element during a magnetic coupling of the first receiving coil and the second receiving coil. At the same time, suppression of reception of magnetic resonance signals from an unwanted surrounding region can ensue by means of the first receiving coil and the second receiving coil.

In another embodiment, the first receiving coil and the second receiving coil are magnetically coupled, with a push-pull vibration mode forming due to a magnetic coupling of the first receiving coil and the second receiving coil. The magnetic coupling between the first receiving coil and the second receiving coil occurs due to a physical proximity between the first receiving coil and the second receiving coil. In this case the magnetic coupling may result from an interaction of electromagnetic fields. The magnetic coupling between the first receiving coil and the second receiving coil leads in particular to a splitting of vibration modes, known as mode-splitting. At least one, in particular two, resonant vibration mode/modes can be generated. Such a vibration mode can be a push-pull vibration mode, which is generated due to the magnetic coupling between the first receiving coil and the second receiving coil. In the push-pull vibration mode, the first receiving coil and the second receiving coil vibrate in a push-pull manner. In this way, magnetic fields in a spatial region between the first receiving coil and the second receiving coil can be amplified. In this spatial region the wall of the housing element is advantageously arranged, as already described. In this push-pull vibration mode a reception sensitivity of the first receiving coil and the second receiving coil is increased in a spatial region of the housing element, in particular of the wall of the housing element. Thus, in the push-pull vibration mode, the first receiving coil and the second receiving coil can receive in the magnetic resonance signals emitted by the wall of the housing element, which is arranged between the first receiving coil and the second receiving coil. At the same time, in the push-pull vibration mode, magnetic fields of the first receiving coil and the second receiving coil in a region surrounding the first receiving coil and the second receiving coil, which is located outside a clearance between the first receiving coil and the second receiving coil, are directed opposite each other and may cancel each other. In this way, in the push-pull vibration mode, reception of magnetic resonance signals from the unwanted surrounding area can be suppressed by the first receiving coil and the second receiving coil. Thus, in the push-pull vibration mode, a selective acquisition of the magnetic resonance signals that are emitted by the wall of the housing element is possible by the first receiving coil and the second receiving coil.

It should be noted that due, to magnetic coupling of the first receiving coil and the second receiving coil, a common vibration mode may form in which the first receiving coil and the second receiving coil vibrate in a common mode. In this common vibration mode, a reception frequency of the first receiving coil and the second receiving coil is then reduced with respect to the first reception frequency and the second reception frequency and is consequently even further removed from the reception frequency for the magnetic resonance imaging.

In another embodiment, the first capacitance value and/or the second capacitance value is/are designed such that the push-pull vibration mode has a push-pull frequency that coincides with the reception frequency for the magnetic resonance imaging. In the push-pull vibration mode, a reception frequency of the first receiving coil and the second receiving coil is therefore increased compared to the first reception frequency and the second reception frequency. In this way, the first receiving coil and the second receiving coil are designed in the push-pull vibration mode to acquire magnetic resonance signals. Magnetic resonance signals are in fact typically acquired in the reception frequency for the magnetic resonance imaging. In this way, the push-pull vibration mode can represent a particularly advantageous receiving mode for the first receiving coil and the second receiving coil to receive magnetic resonance signals to depict the housing element, in particular the wall of the housing element.

In another embodiment, a first spatial region and a second spatial region are defined by a spacing between the first receiving coil and the second receiving coil, so the second spatial region is spatially separated from the first spatial region, the first receiving coil and the second receiving coil have a higher reception sensitivity in the push-pull vibration mode in the first spatial region than in the second spatial region. The first receiving coil can define a first plane, while the second receiving coil can define a second plane. The spacing can constitute a part of the region that lies between the first plane and the second plane. The spacing can also include that region. The wall of the housing element can be arranged in the first spatial region. In the second spatial region, tissue of an examination object can be located. The higher reception sensitivity in the first spatial region is particularly advantageous because reception by the first receiving coil and the second receiving coil of magnetic resonance signals that are emitted by the wall of the housing element is desired, while reception of magnetic resonance signals that are emitted by tissue of the examination object is not desired. Thus, a magnetic resonance image can be reconstructed from the magnetic resonance signals received by the first receiving coil and the second receiving coil, in which image the wall of the housing element is particularly clearly differentiated from tissue of the examination object. In this magnetic resonance image, the wall of the housing element can be detected in a simple manner and so the position and/or geometry of the radio-frequency coil assembly can be reconstructed in a particularly precise manner.

In another embodiment, the radio-frequency coil assembly has a detuning circuit that is designed to detune the reception frequency of the first receiving coil and/or the second receiving coil. The detuning circuit is designed to detune the first reception frequency or the second reception frequency. If the first reception frequency is detuned, then no push-pull vibration mode will form and the second reception frequency will likewise be sufficiently far removed from the reception frequency for the magnetic resonance imaging. This is also possible vice versa when detuning the second reception frequency. In this way, by the detuning of the first reception frequency or the second reception frequency, the detuning circuit can suppress reception of magnetic resonance signals by the first receiving coil and the second receiving coil. This can be advantageous when a magnetization of the tissue of the examination object is to be excited or when magnetic resonance signals from the examination object are to be acquired. From these magnetic resonance signals, it is then possible to reconstruct diagnostic magnetic resonance image data that do not have any interfering signal influence from magnetic resonance signals, by the first receiving coil and the second receiving coil. The diagnostic magnetic resonance image data will then not show the wall of the housing element. The detuning circuit can consequently allow a variable control of reception of magnetic resonance signals by the first receiving coil and the second receiving coil. It is also conceivable for there to be a detuning circuit both for the first receiving coil and for the second receiving coil.

The method according to the invention for determining a position and/or geometry of a housing element of a radio-frequency coil assembly in a magnetic resonance scanner, wherein the radio-frequency coil assembly encompasses the housing element, a first receiving coil and a second receiving coil, includes the following process steps. Nuclear spins in a material of the housing element are excited by the operation of the scanner. Magnetic resonance signals are acquired from the housing element by the first receiving coil and the second receiving coil, with the first receiving coil and the second receiving coil being magnetically coupled for the acquisition of the magnetic resonance signals, such that, in a spatial region of the housing element, a reception sensitivity of the first receiving coil and the second receiving coil toward a further spatial region that is spatially separated from the spatial region of the housing element is increased. Magnetic resonance image data are reconstructed from the magnetic resonance signals, with the magnetic resonance image data shows the housing element. A position and/or geometry of the housing element is determined in the magnetic resonance image data.

The excitation of the nuclear spins may ensue by radiation of a radio-frequency excitation pulse. The excitation of the nuclear spins and the acquisition of the magnetic resonance signals ensue during the magnetic resonance scan. This means that the magnetic resonance signals are acquired after positioning a patient inside the magnetic resonance scanner to capture diagnostic magnetic resonance image data for diagnostic purposes. The position of the examination object is preferably retained between the acquisition of the magnetic resonance signals and the capture of the diagnostic magnetic resonance image data, such that the position of the at least one radio-frequency coil assembly is retained between the acquisition of the magnetic resonance signals and the capture of the diagnostic magnetic resonance image data.

For the acquisition of the magnetic resonance signals from the housing element, the first receiving coil and the second receiving coil in the radio-frequency coil assembly in particular are actively connected. The at least one radio-frequency antenna in the radio-frequency coil assembly can be switched to inactive mode. The spatial region of the housing element is formed by the first spatial region mentioned above. The further spatial region is formed by the second spatial region described above.

The reconstruction of the magnetic resonance image data from the magnetic resonance signals and the determination of the position of the housing element in the magnetic resonance image data can ensue in a manner that is common practice for those skilled in the art. For example, to determine the position and/or the geometry of the housing element, a model of the housing element can be uploaded from a database. Segmentation of the housing element is also conceivable.

Due to the capture technique used, described in more above, the representation of the housing element in the magnetic resonance image data is clearly differentiated from a surrounding area. Thus, by execution of the method according to the invention, the position of the housing element can be determined in a simple and precise manner. Due to the position of the housing element that has been determined, a position and/or geometry of the radio-frequency coil assembly are/is determined. The use of a model of the radio-frequency coil assembly, which reproduces in particular a position of the housing element on the radio-frequency coil assembly, is likewise advantageous for this purpose.

In another embodiment of the method, during the excitation of the nuclear spins in the housing element material, the first receiving coil and the second receiving coil are magnetically coupled such that in the spatial region of the housing element, a B1 field used for the excitation of the nuclear spins is amplified. In this way, a specified flip angle of nuclear spins can be attained in the spatial region of the housing element by means of a lower amount of radio-frequency energy being radiated. Thus signal strength can be increased and/or SAR exposure of an examination object can be reduced.

In another embodiment of the method, a position-dependent attenuation map of the radio-frequency coil assembly is determined using the position of the housing element that has been determined. An attenuation map of a radio-frequency coil assembly typically includes spatially resolved information about the attenuation values for the radio-frequency coil assembly with respect to the attenuation of photons, for example, of photons with an energy of 511 keV in PET imaging. The attenuation values for the radio-frequency coil assembly depend, inter alia, on the material and the materials strength of the radio-frequency coil assembly. The attenuation values are typically stored in the form of linear attenuation coefficients with the unit 1/cm. An attenuation map can be used for attenuation correction of nuclear medicine data. For the attenuation correction, the part of the radio-frequency coil assembly that is relevant is the one located between the place of origin of the gamma-quanta and the detector.

The determination of a position-dependent attenuation map can ensue by the reconstructed actual position and/or geometry of the radio-frequency coil assembly in the magnetic resonance scanner during a combined magnetic resonance scan. For an attenuation correction of the radio-frequency coil assembly, the position of the radio-frequency coil assembly should be determined with an accuracy of 10 mm maximum, advantageously with 5 mm maximum, ideally 3 mm maximum.

The determination of the position-dependent attenuation map can include an adjustment and/or a registration and/or a transformation of a general attenuation map of the radio-frequency coil assembly using the reconstructed position and/or geometry of the radio-frequency coil assembly. A general attenuation map of a radio-frequency coil assembly can be an attenuation map that is not adjusted to the position and geometry of the radio-frequency coil assembly. Here, the general attenuation map can be loaded from a database. The transformation of the attenuation map can be rigid and consequently include only one movement of the general attenuation map in at least one spatial direction. However, the transformation can also be non-rigid and change the shape of the radio-frequency coil assembly in the general attenuation map. Consequently, an automated attenuation correction of the radio-frequency coil assembly is possible in combined magnetic resonance imaging. Advantageously, nuclear medicine image data captured at the same time as magnetic resonance image data can thus be unaffected or be affected only to a reduced extent by the quantification errors and artifacts generated by the presence of the radio-frequency coil assembly.

In another embodiment of the method, the radio-frequency coil assembly is designed according to the invention. In this way, the first receiving coil and the second receiving coil are arranged so that they are situated in an advantageous manner with respect to the housing element, in particular with respect to the wall of the housing element. In this way, the magnetic coupling described above is able to form in an advantageous manner.

The magnetic resonance apparatus according to the invention has a scanner that encompasses a radio-frequency coil assembly, which includes a housing element, a first receiving coil and a second receiving coil, an excitation coil and a computer that includes a reconstruction processor and a determination processor, the magnetic resonance apparatus being designed to carry out a method according to the invention.

It should be noted that the magnetic resonance apparatus may also include a further imaging unit (scanner). Thus the magnetic resonance apparatus can also be designed as a combined imaging system. For example, in addition to a magnetic resonance scanner, the magnetic resonance apparatus may also have a positron emission tomography (PET) scanner or a single photon emission tomography imaging (SPECT) scanner. Thus the magnetic resonance apparatus may also be designed as a magnetic resonance-PET apparatus or as a magnetic resonance-SPECT apparatus.

Consequently, the magnetic resonance apparatus is designed to carry out a method for the determination of the position and/or geometry of the housing element of the radio-frequency coil assembly in the magnetic resonance scanner. The excitation coil is designed to excite nuclear spins of a material of the housing element. The acquisition of magnetic resonance signals from the housing element is achieved by the first receiving coil and the second receiving coil. For the acquisition of the magnetic resonance signals, the first receiving coil and the second receiving coil are magnetically coupled such that, in a spatial region of the housing element, the reception sensitivity of the first receiving coil and the second receiving coil toward a further spatial region that is spatially separated from the spatial region of the housing element, is increased. The reconstruction computer is designed to reconstruct magnetic resonance image data from the magnetic resonance signals, and the magnetic resonance image data show the housing element. The determination processor is designed to determine the position and/or geometry of the housing element in the magnetic resonance image data.

The advantages of the method according to the invention and of the magnetic resonance apparatus according to the invention correspond to the advantages of the radio-frequency coil assembly according to the invention, which have been described in detail above. Features, advantages or alternative embodiments referred to above may be equally applied to the other aspects of the invention. The functional features of the method are designed using corresponding physical modules, in particular using hardware modules.

BRIEF DESCRIPTION OF THE DRAWINGS

FIG. 4 is a flowchart of an embodiment of a method according to the invention.

DESCRIPTION OF THE PREFERRED EMBODIMENTS

Figure 1:
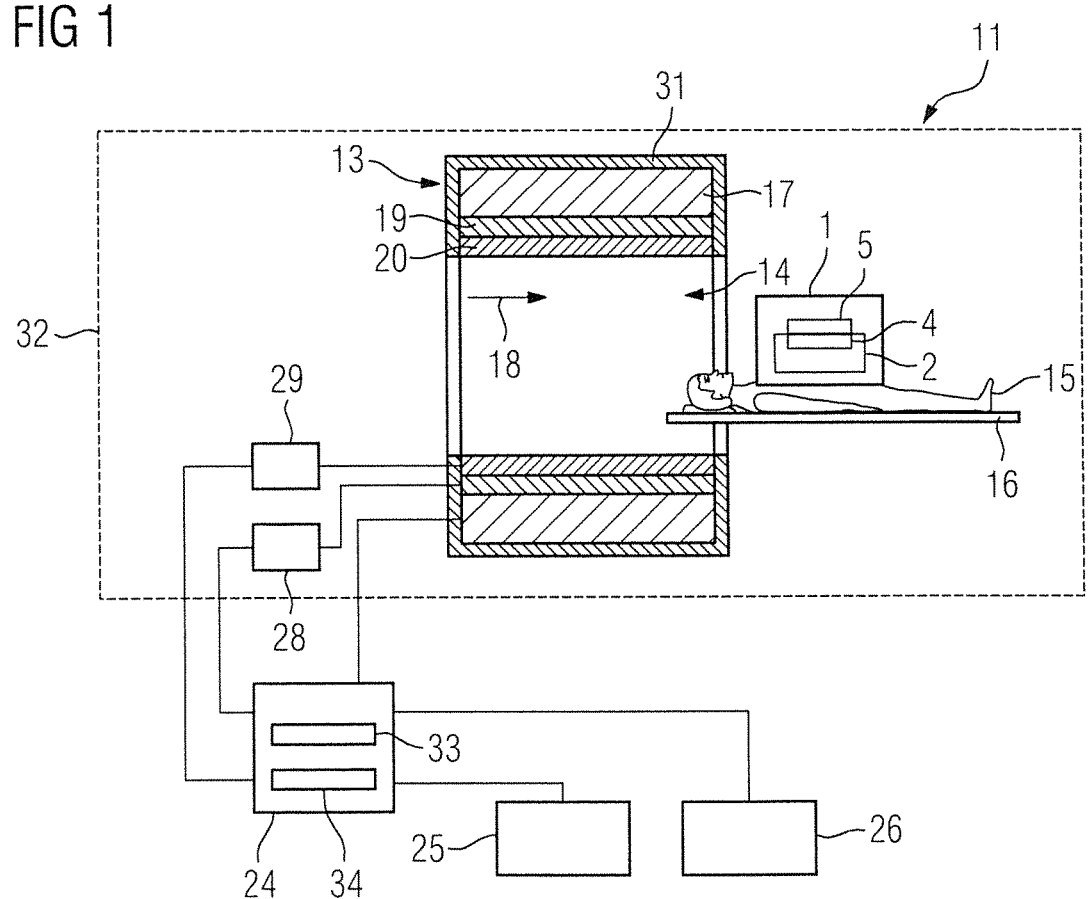
FIG. 1 shows a magnetic resonance apparatus according to the invention with a radio-frequency coil assembly according to the invention in schematic form.

FIG. 1 shows a block diagram of a magnetic resonance apparatus 11 according to the invention with a radio-frequency coil assembly 1 according to the invention. As already described, the magnetic resonance apparatus 11 can be a combined magnetic resonance apparatus 11, for example, a magnetic resonance-PET apparatus or a combined magnetic resonance-SPECT apparatus.

The magnetic resonance apparatus 11 includes a detector formed of a scanner 13 with a basic field magnet 17 to generate a strong, constant, basic magnetic field 18. In addition, the scanner 13 has a cylindrical patient-accommodation region 14 to accommodate an examination object 15, in the present case a patient, the region 14 being cylindrically enclosed in a circumferential direction by the scanner 13. The patient 15 can be moved into the patient-accommodation region 14 by a patient-positioning support 16 of the scanner 13. For this purpose, the patient-positioning support 16 has a bed that is movably arranged inside the scanner 13. The scanner 13 is protected externally by a housing shell 31.

The scanner 13 further has a gradient coil arrangement 19 to generate magnetic field gradients, which are used for spatial encoding during imaging. The gradient coil arrangement 19 is controlled by a gradient control processor 28. Furthermore, the scanner 13 has an excitation coil 20, which in the scenario shown is designed as a body coil that is incorporated in a fixed manner into the magnetic resonance scanner 13, and a radio-frequency antenna control processor 29 to excite nuclear spins in the patient 15 so as to deviate from the polarization that is established in the basic magnetic field 18 generated by the basic field magnet 17. The excitation coil 20 is controlled by the radio-frequency antenna control processor 29 and radiates radio-frequency magnetic resonance-sequences into a scanning volume that is essentially formed of the patient-accommodation region 14. The excitation coil 20 is further designed to receive magnetic resonance signals, originating from inside the patient 15 that result as the nuclear spins relax from the aforementioned excitation.

The magnetic resonance scanner 13 has a radio-frequency coil assembly 1 that is designed to receive magnetic resonance signals. For a magnetic resonance scan, the radio-frequency coil assembly 1 is placed by a medical technician on a body region of the examination object 15 that is to be investigated. In the present embodiment, the radio-frequency coil assembly 1 is formed as a body antenna. It is also conceivable at any time for the radio-frequency coil assembly 1 to be designed as a knee-antenna and/or back-antenna, or other types of local coil assemblies. It is also conceivable for more than one radio-frequency coil assembly 1 to be positioned on the examination object 15. Typical is a use of up to ten radio-frequency coil assembly 1 to capture the magnetic resonance signals.

Figure 2:
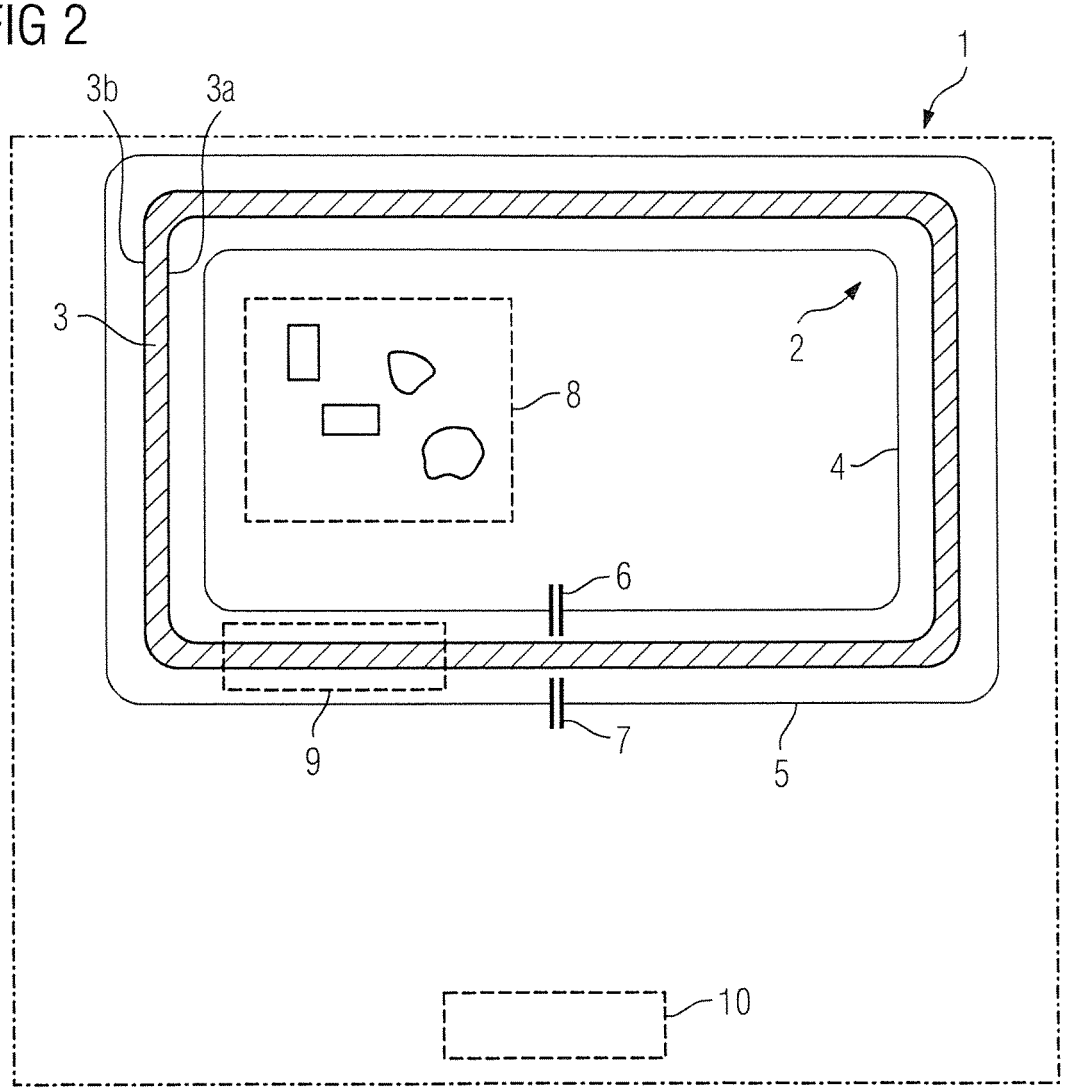
FIG. 2 shows a first embodiment of a radio-frequency coil assembly according to the invention in schematic form.
Figure 3:
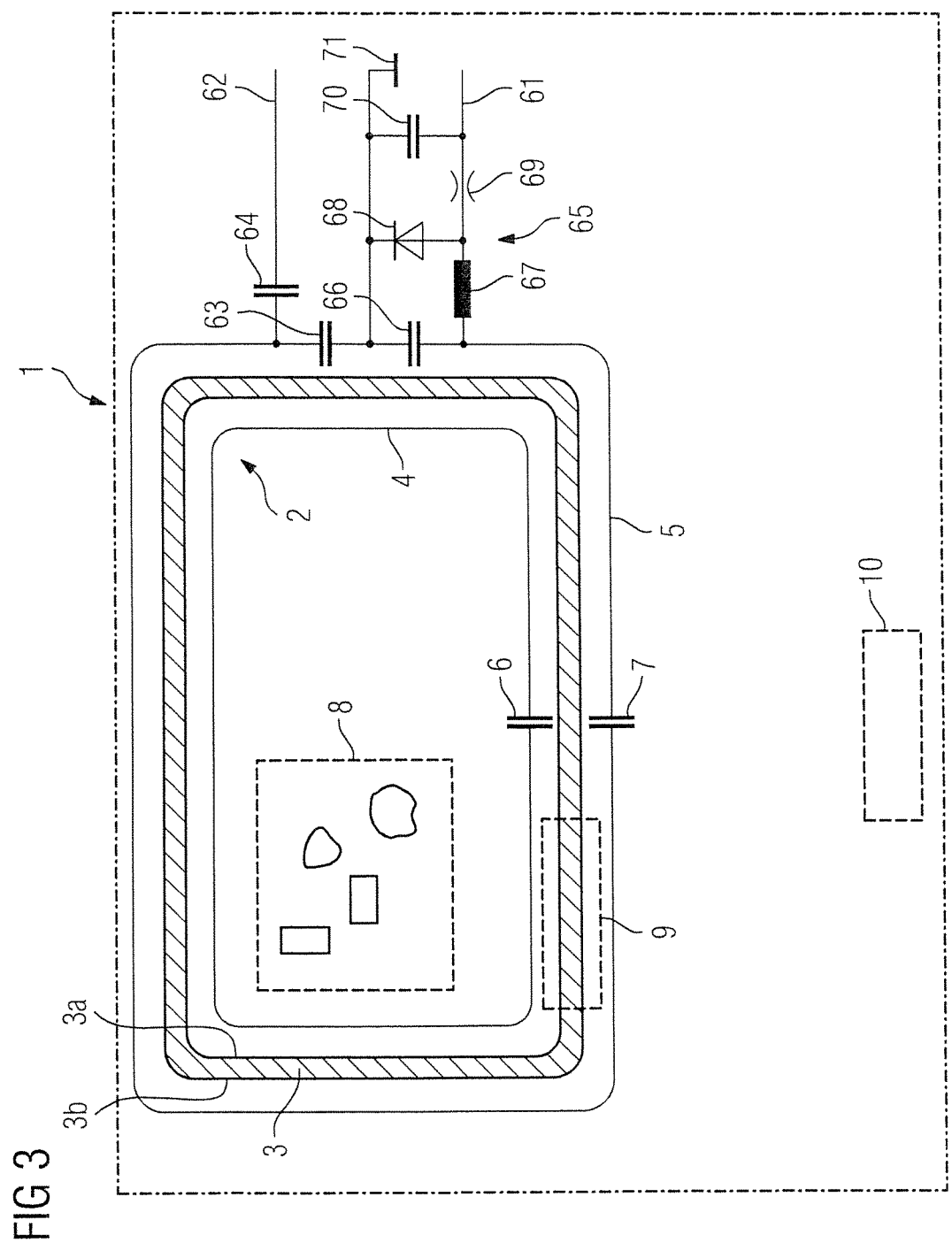
FIG. 3 shows a second embodiment of a radio-frequency coil assembly according to the invention in schematic form.

The radio-frequency coil assembly 1 shown is depicted schematically only. Detailed embodiments of the radio-frequency coil assembly 1 are shown in FIG. 2 and FIG. 3. The radio-frequency coil assembly 1 includes a housing element 2 and a first receiving coil 4, and a second receiving coil 5. The radio-frequency coil assembly 1 can also be controlled by the radio-frequency antenna control processor 29.

To control the basic field magnet 17, the gradient control processor 28 and the radio-frequency antenna control processor 29, the magnetic resonance apparatus 11 has a computation computer 24. The computation computer 24 centrally controls the magnetic resonance scanner 13, such as to execute a predetermined image-generating gradient echo sequence. Control information, such as imaging parameters, and reconstructed magnetic resonance images can be provided for a user on an output unit, in the present case a display monitor 25, of the magnetic resonance apparatus 11. In addition, the magnetic resonance apparatus 11 has an input interface 26, via which information and/or parameters can be entered by a user during a planning procedure. The computation computer 24 can include the gradient control processor 28 and/or radio-frequency antenna control processor 29 and/or the display monitor 25 and/or the input interface 26. In the embodiment shown, the computation computer 24 includes a reconstruction computer 33 and a determination processor 34.

The magnetic resonance apparatus 11 is consequently designed in conjunction with the excitation coil 20 and the computation computer 24 to implement a method according to the invention as per FIG. 5 to determine a position and/or geometry of the housing element 2 of the radio-frequency coil assembly 1 in the magnetic resonance apparatus 11. The magnetic resonance apparatus 11 may include further components that magnetic resonance apparatuses usually have. Moreover, the basic mode of function of a magnetic resonance apparatus is known to those skilled in the art, so that a detailed description of the further components is not necessary herein.

FIG. 2 shows a first embodiment of a radio-frequency coil assembly 1 according to the invention. FIG. 2 shows a part of the radio-frequency coil assembly 1, namely the part that includes the housing element 2 of the radio-frequency coil assembly 1. The radio-frequency coil assembly can also have further housing elements in addition to the housing element 2 that is shown. Furthermore, the radio-frequency coil assembly 1 typically further has at least one radio-frequency antenna, which is not shown and which is designed to receive magnetic resonance signals originating from a body region of the examination object 15.

The radio-frequency coil assembly 1 for magnetic resonance imaging that is shown includes a housing element 2 with a wall 3. Furthermore, the radio-frequency coil assembly 1 includes a first receiving coil 4 and a second receiving coil 5. The wall 3 has an inner side 3a and an outer side 3b, the first receiving coil 4 being arranged on the inner side 3a and the second receiving coil 5 being arranged on the outer side 3b.

Furthermore, the first receiving coil 4 and/or the second receiving coil 5 are/is arranged directly on the wall 3 of the housing element 2. For example, the first receiving coil 4 and/or the second receiving coil 5 can be fixed on the wall 3. The first receiving coil 4 and the second receiving coil 5 are arranged in particular only with a small physical distance between them. The physical distance advantageously corresponds only to the wall 3 of the housing element 2. The physical distance amounts to less than two centimeters, preferably to less than one centimeter, and most preferably to a maximum of less than five millimeters.

In the embodiment shown, the wall 3 of the housing element 2 serves to mount an electronic amplification circuit 8 of the radio-frequency coil assembly 1a. The inner side 3a of the wall 3 is then the side of the wall 3 that faces the electronic amplification circuit 8. The outer side 3b of the wall 3 is then the side of the wall 3 that faces away from the electronic amplification circuit 8. The electronic amplification circuit 8 can include, for example, a conductor board with electronic and mechanical components. The wall of the housing element 2 is composed of plastic, for example.

The first receiving coil 4 and the second receiving coil 5 have a metal conductor. This conductor can be made of copper, for example. Furthermore, the first receiving coil 4 has a first shortening capacitor 6 and the second receiving coil 5 has a second shortening capacitor 7. The first receiving coil 4 can have more than one first shortening capacitor 6, and/or the second receiving coil 5 can have more than one second shortening capacitor 7. The first shortening capacitor 6 has a first capacitance value with which the first receiving coil 4 is tuned to a first reception frequency. The second shortening capacitor 7 has a second capacitance value with which the second receiving coil 5 is tuned to a second reception frequency. The first shortening capacitor 6 and/or the at least one second shortening capacitor 7 has, for example, a capacitance value in the picofarad range, possibly between 5 to 100 picofarads, in particular between 10 to 30 picofarads. Advantageously the first capacitance value and/or the second capacitance value is selected such that the first reception frequency and the second reception frequency is lower than a reception frequency for the magnetic resonance imaging.

In the embodiment shown, the first receiving coil 4 and the second receiving coil 5 are arranged such that they are magnetically coupled. Due to the magnetic coupling of the first receiving coil 4 and the second receiving coil 5 there is formed, inter alia, a push-pull vibration mode. The first capacitance value and the second capacitance value are in this case designed such that the push-pull vibration mode has a push-pull frequency that coincides with the reception frequency for the magnetic resonance imaging.

In FIG. 3 a first spatial region 9 and a second spatial region 10 are designated. A spacing between the first receiving coil 4 and the second receiving coil 5 defines the first spatial region 9. It should be noted that for clarity only one section of the first spatial region 9 is shown in FIG. 3. The second spatial region 10 is designed to be spatially separated from the first spatial region 9. Again for clarity, only one random section from the second spatial region 10 is shown in FIG. 3. In the push-pull vibration mode, the first receiving coil 4 and the second receiving coil 5 have a higher reception sensitivity in the first spatial region 9 than in the second spatial region 10.

For example, in a simplified assumption, where there is a given circuit inductance L and circuit capacitance C of the first receiving coil 4 and the second receiving coil 5, the first reception frequency f and the second reception frequency f can be calculated as:

$$f = \frac{1}{2\pi\sqrt{L \cdot C}}$$

Here, the first reception frequency and the second reception frequency f differ little or are identical.

Where there is magnetic coupling between the first receiving coil 4 and the second receiving coil 5 with a coupling inductance M, the push-pull vibration mode with the following push-pull frequency $f_V$ will result in:

$$f_V = \frac{1}{2\pi\sqrt{(L-M) \cdot C}}$$

It can be seen that the values L, M and C can be selected such that the push-pull frequency $f_V$ is equal to the reception frequency for the magnetic resonance imaging. The push-pull frequency $f_V$ can therefore correspond to a precession frequency of protons in the basic magnetic field 18 of the magnetic resonance apparatus 11.

For completeness, it should be noted that a push-pull vibration mode can also form on the basis of the magnetic coupling of the first receiving coil 4 and the second receiving coil 5 with the following push-pull frequency $f_S$:

$$f_S = \frac{1}{2\pi\sqrt{(L+M) \cdot C}}$$

It can be seen that the push-pull frequency $f_V$ is higher than the first reception frequency of the first receiving coil 4 or the second reception frequency of the second receiving coil 5. Conversely, the push-pull frequency $f_S$ is lower than the first reception frequency of the first receiving coil 4 or the second reception frequency of the second receiving coil 5 and is consequently even further removed from the reception frequency for the magnetic resonance imaging. The first reception frequency of the first receiving coil 4 or the second reception frequency of the second receiving coil 5 is exactly mid-way between the push-pull frequency $f_V$ and the push-pull frequency $f_S$.

In addition, the radio-frequency coil 1 will have a further connection, which is not shown, to the magnetic resonance scanner 13 to transmit data and/or energy. Thus the first receiving coil 3 and the second receiving coil 4 will also have a connection to an output interface, which is not shown, and/or to an input interface, which is not shown. An example of an option for such a connection is shown in FIG. 3.

FIG. 3 shows a second embodiment of a radio-frequency coil assembly 1 according to the invention.

FIG. 3 depicts a variant of the radio-frequency coil assembly 1 that is an alternative to that shown in FIG. 2. The description that follows is basically restricted to the differences thereof from the embodiment in FIG. 2, reference being made to the description of the embodiment in FIG. 2 regarding components, features and functions that remain the same. Components, features and functions that essentially remain the same are numbered with the same reference signs.

In the embodiment shown in FIG. 3, the second receiving coil 5 is connected to an alternating current output interface 62, which is in turn connected to a pre-amplifier. Thus the magnetic resonance signals received by the second receiving coil 5 are amplified by the pre-amplifier. Furthermore, a ground connection 71 is provided. In this way, the impedance of the push-pull mode described in FIG. 2 is adjusted to an impedance of the pre-amplifier, for example 50 Ohms, by a parallel capacitor 63 and a series capacitor 64. Such a connection to a pre-amplifier may also be provided for the first receiving coil 4, of course, and for clarity is not shown in FIG. 3.

The radio-frequency coil assembly 1 shown further has a detuning circuit 65, which is designed to detune the reception frequency of the second receiving coil 5. The detuning circuit 65 can also be designed in a different manner from that shown, to detune a reception frequency of the first receiving coil 4. Two detuning circuits 65 for the two receiving coils 4, 5 are also conceivable.

In the embodiment shown, the detuning circuit 65 has a detuning capacitor 66, a detuning coil 67, a radio-frequency diode 68, such as a PIN diode for example, a choke 69, and a blocking capacitor 70. These circuit elements 66, 67, 68, 69, 70 are arranged between the second receiving coil 5 and a direct current input interface 61. Of course, the detuning circuit 65 can also be designed in a different manner from that shown.

The reception frequency of the second receiving coil 5 can be detuned by the radio-frequency diode 68 and the detuning coil 67. If the reception frequency is to be detuned, then the radio-frequency diode 68 can be interconnected to the direct current input interface 61. In this way, a magnetic coupling between the first receiving coil 4 and the second receiving coil 5 can likewise be dispensed with. In the event of a detuning of the second receiving coil 5, the receive frequencies of the two receiving coils 4, 5 are then far enough removed from a reception frequency for the magnetic resonance imaging for no reception of magnetic resonance signals to ensue by the first receiving coil 4 and the second receiving coil 5 when the second receiving coil 5 is detuned.

FIG. 4 shows a flowchart of an embodiment of a method according to the invention to determine the position and/or a geometry of a housing element 2 of a radio-frequency coil assembly 1 in a magnetic resonance apparatus 11. The radio-frequency coil assembly 1 includes the housing element 2, a first receiving coil 4 and a second receiving coil 5. The radio-frequency coil assembly 1 can be designed as shown in FIG. 2 or FIG. 3 as a radio-frequency coil assembly 1 according to the invention.

In a first process step 50, excitation of nuclear spins of a material of the housing element 2 is achieved by means of the excitation coil 20 of the magnetic resonance apparatus 11. In the excitation of the nuclear spins of the material of the housing element 2, the first receiving coil 4 and the second receiving coil 5 are advantageously magnetically coupled, such that, in a spatial region of the housing element 2, a B1 field used to excite the nuclear spins is amplified.

In a further process step 51, acquisition of magnetic resonance signals from the housing element 2 is achieved with the first receiving coil 4 and the second receiving coil 5. For the acquisition of the magnetic resonance signals, the first receiving coil 4 and the second receiving coil 5 are magnetically coupled such that, in the spatial region of the housing element 2, a reception sensitivity of the first receiving coil 4 and the second receiving coil 5 with respect to a further spatial region, which is spatially separated from the spatial region of the housing element 2, is increased.

In a further process step 52, a reconstruction of magnetic resonance image data is implemented from the magnetic resonance signals by the reconstruction processor 33 of the computation computer 24 of the magnetic resonance apparatus 11, wherein the magnetic resonance image data depicts the housing element 2.

In a further process step 53, a determination of a position and/or a geometry of the housing element 2 in the magnetic resonance image data is achieved by the determination processor 34 of the computation computer 24 of the magnetic resonance apparatus 11.

After the position and/or the geometry of the housing element 2 has been determined, this information can usefully be further processed. A possible option is a further, in particular an optional, process step 54 to determine, by the position of the housing element 2 that has been determined, a position-dependent attenuation map of the radio-frequency coil assembly 1 by the computation computer 24 of the magnetic resonance apparatus 11.

The process steps of the method according to the invention shown in FIG. 4 are carried out by the computation computer 24 of the magnetic resonance apparatus 11. For this purpose, the computation computer 24 includes the requisite software and/or computer programs, which are stored in a memory of the computation computer 24. The software and/or computer programs include programming code that is designed to carry out the method according to the invention when the program code and/or the software are/is run in the computation computer 24 by a processing circuitry of the computation computer 24.

Although modifications and changes may be suggested by those skilled in the art, it is the intention of the inventor to embody within the patent warranted hereon all changes and modifications as reasonably and properly come within the scope of his contribution to the art.

I claim as my invention:

1. A radio-frequency coil assembly for magnetic resonance imaging, comprising:
   an assembly housing comprising a wall;
   a first reception coil disposed in said assembly housing on a first side of said wall, and being situated with a spatial relationship with respect to said wall, and having a coil configuration, designed in combination to cause said first reception coil to receive magnetic resonance signals originating from a material of said wall;
   a second reception coil in said assembly housing on a second, opposite side of said wall, said second reception coil having a spatial relationship with respect to said wall, and a coil configuration, designed in combination to also cause said second reception coil to receive magnetic resonance signals originating from said material of said wall; and
   said first reception coil comprising at least one first shortening capacitor having a first capacitance value that tunes said first reception coil to a first reception frequency, and said second reception coil comprising at least one second shortening capacitor having a second capacitance value that tunes said second reception coil to a second reception frequency, at least one of said first reception frequency and said second reception frequency being lower than a reception frequency for receiving magnetic resonance signals from a source other than said wall.

2. A radio-frequency assembly as claimed in claim 1 wherein said wall has an inner side and outer side with respect to said assembly housing, and wherein said first reception coil is situated on said inner side of said wall and said second reception coil is situated on said outer side of said wall.

3. A radio-frequency assembly as claimed in claim 1 comprising an electronic amplification circuit surrounded by said wall.

4. A radio-frequency assembly as claimed in claim 1 wherein at least one of said first reception coil and said second reception coil is situated directly on said wall.

5. A radio-frequency assembly for magnetic resonance imaging, comprising:
   an assembly housing comprising a wall;
   a first reception coil disposed in said assembly housing on a first side of said wall, and being situated with a spatial relationship with respect to said wall, and having a coil configuration, designed in combination to cause said first reception coil to receive magnetic resonance signals originating from a material of said wall;
   a second reception coil in said assembly housing on a second, opposite side of said wall, said second reception coil having a spatial relationship with respect to said wall, and a coil configuration, designed in combination to also cause said second reception coil to receive magnetic resonance signals originating from said material of said wall;
   said first reception coil comprising at least one first shortening capacitor, and said second reception coil comprising at least one second shortening capacitor, said at least one first shortening capacitor having a first capacitance value and said at least one second shortening capacitor having a second capacitance value, with at least one of said first capacitance value and said second capacitance value being selected to cause said push-pull vibration mode to have a push-pull frequency that coincides with a reception frequency for receiving magnetic resonance signals that originate from a source other than said wall; and
   said spatial relationship of said first reception frequency with respect to said wall and said spatial relationship of said reception coil with respect to said wall causing said first and second reception coils to be magnetically coupled to each other to produce a push-pull vibration mode between said first reception coil and said second reception coil.

6. A radio-frequency assembly as claimed in claim 5 wherein said spatial relationship of said first reception coil with respect to said wall and said spatial relationship of said second reception coil with respect to said wall define a first spatial region between the first reception coil and the second reception coil, and a second spatial region that is spatially separated from said first spatial region, and wherein said first reception coil and said second reception coil have a higher reception sensitivity in the push-pull vibration mode in the first spatial region than in the second spatial region.

7. A radio-frequency assembly as claimed in claim 1 comprising a detuning circuit configured to tune a reception frequency of at least one of said first reception coil and said second reception coil.

8. A method for determining a position and/or a geometry of a housing element of a radio-frequency coil assembly in a magnetic resonance unit, wherein the radio-frequency coil assembly includes the housing element, a first receiving coil and a second receiving coil, comprising:

exciting nuclear spins of a material of the housing element;

acquiring magnetic resonance signals of the housing element by means of the first receiving coil and the second receiving coil, wherein for the acquisition of the magnetic resonance signals, the first receiving coil and the second receiving coil are magnetically coupled such that, in a spatial region of the housing element, a reception sensitivity of the first receiving coil and of the second receiving coil is increased towards a further spatial region, which is spatially separated from the spatial region of the housing element;

reconstructing magnetic resonance image data from the magnetic resonance signals, wherein the magnetic resonance image data shows the housing element;

in a computer supplied with said magnetic resonance image data, determining a position and/or a geometry of the housing element in the magnetic resonance image data.

9. The method as claimed in claim 8, wherein, during the excitation of the nuclear spins of the material of the housing element, the first receiving coil and the second receiving coil are magnetically coupled such that, in the spatial region of the housing element, a B1 field used to excite the nuclear spins is amplified.

10. The method as claimed in claim 8 comprising determining a position-dependent attenuation map of the radio-frequency coil assembly using the position of the housing element that has been determined.

11. A magnetic resonance apparatus comprising:

a magnetic resonance data acquisition scanner; and a radio-frequency coil assembly situated in said scanner, said radio-frequency coil assembly comprising an assembly housing comprising a wall, a first reception coil disposed in said assembly housing on a first side of said wall, and being situated with a spatial relationship with respect to said wall, and having a coil configuration, designed in combination to cause said first reception coil to receive magnetic resonance signals originating from a material of said wall, and a second reception coil in said assembly housing on a second, opposite side of said wall, said second reception coil having a spatial relationship with respect to said wall, and a coil configuration, designed in combination to also cause said second reception coil to receive magnetic resonance signals originating from said material of said wall, and said first reception coil comprising at least one first shortening capacitor having a first capacitance value that tunes said first reception coil to a first reception frequency, and said second reception coil comprising at least one second shortening capacitor having a second capacitance value that tunes said second reception coil to a second reception frequency, at least one of said first reception frequency and said second reception frequency being lower than a reception frequency for receiving magnetic resonance signals from a source other than said wall.

12. A magnetic resonance apparatus comprising:

a magnetic resonance data acquisition scanner; and a radio-frequency coil assembly situated in said scanner, said radio-frequency coil assembly comprising an assembly housing comprising a wall, a first reception coil disposed in said assembly housing on a first side of said wall, and being situated with a spatial relationship with respect to said wall, and having a coil configuration, designed in combination to cause said first reception coil to receive magnetic resonance signals originating from a material of said wall, a second reception coil in said assembly housing on a second, opposite side of said wall, said second reception coil having a spatial relationship with respect to said wall, and a coil configuration, designed in combination to also cause said second reception coil to receive magnetic resonance signals originating from said material of said wall, said first reception coil comprising at least one first shortening capacitor, and said second reception coil comprising at least one second shortening capacitor, said at least one first shortening capacitor having a first capacitance value and said at least one second shortening capacitor having a second capacitance value, with at least one of said first capacitance value and said second capacitance value being selected to cause said push-pull vibration mode to have a push-pull frequency that coincides with a reception frequency for receiving magnetic resonance signals that originate from a source other than said wall, and said spatial relationship of said first reception frequency with respect to said wall and said spatial relationship of said reception coil with respect to said wall causing said first and second reception coils to be magnetically coupled to each other to produce a push-pull vibration mode between said first reception coil and said second reception coil.

\* \* \* \* \*